(12) United States Patent
Hatta

(10) Patent No.: US 9,739,828 B2
(45) Date of Patent: Aug. 22, 2017

(54) PROBE DEVICE

(71) Applicant: Tokyo Electron Limited, Tokyo (JP)

(72) Inventor: Masataka Hatta, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/779,870

(22) PCT Filed: Mar. 18, 2014

(86) PCT No.: PCT/JP2014/058149
§ 371 (c)(1),
(2) Date: Sep. 24, 2015

(87) PCT Pub. No.: WO2014/157120
PCT Pub. Date: Oct. 2, 2014

(65) Prior Publication Data
US 2016/0047856 A1 Feb. 18, 2016

(30) Foreign Application Priority Data

Mar. 27, 2013 (JP) ................. 2013-065510

(51) Int. Cl.
*G01R 31/28* (2006.01)
*G01R 1/18* (2006.01)

(52) U.S. Cl.
CPC ..... *G01R 31/2874* (2013.01); *G01R 31/2865* (2013.01); *G01R 1/18* (2013.01); *G01R 31/2891* (2013.01)

(58) Field of Classification Search
CPC combination set(s) only.
See application file for complete search history.

(56) References Cited

U.S. PATENT DOCUMENTS 5,610,529 A 3/1997 Schwindt
6,634,245 B1 * 10/2003 Yoshioka ............... H01L 21/68
324/750.2

(Continued)

FOREIGN PATENT DOCUMENTS

| JP | 3351956 B2 | 12/2002 |
|---|---|---|
| WO | 99/34412 A2 | 7/1999 |
| WO | 02/09155 A2 | 1/2002 |

OTHER PUBLICATIONS

International Search Report dated May 20, 2014.

*Primary Examiner* — Clayton E Laballe
*Assistant Examiner* — Jas Sanghera

(57) ABSTRACT

A probe device, for performing an electrical test of a semiconductor device formed on a semiconductor wafer, includes a mounting table on which the semiconductor wafer is mounted, a driving mechanism configured to bring a probe into contact with an electrode of the semiconductor device mounted on the mounting table, and a temperature control mechanism configured to control a temperature of the mounting table. The mounting table includes a disk-shaped first electrode, a disk-shaped second electrode, and a disk-shaped insulating plate interposed between the first electrode and the second electrode. The first electrode, the second electrode and the insulating plate are fixed to each other at a fixing part provided at their respective centers, and are locked to be movable in a diametric direction at a locking part provided at an outer side of the fixing part in the diametric direction.

10 Claims, 4 Drawing Sheets

(56) References Cited

U.S. PATENT DOCUMENTS

2002/0014894 A1\* 2/2002 Yonezawa .......... G01R 31/2865
　　　　　　　　　　　　　　　　　　　324/750.08
2002/0163350 A1\* 11/2002 Kiesewetter ......... G01R 1/0408
　　　　　　　　　　　　　　　　　　　324/756.01

\* cited by examiner

PROBE DEVICE

CROSS REFERENCE

This application is a National Stage Application of, and claims priority to, PCT Application No. PCT/JP2014/058149, filed on Mar. 18, 2014, entitled "Probe Device," which claims priority to Japanese Patent Application No. 2013-065510, filed on Mar. 27, 2013. The foregoing patent applications are herein incorporated by reference by entirety for all purposes.

FIELD OF THE INVENTION

The present invention relates to a probe device.

BACKGROUND OF THE INVENTION

In a manufacturing process of a semiconductor device, a probe device is used to perform an electrical test of a semiconductor device formed on a semiconductor wafer. The probe device drives a mounting table on which the semiconductor wafer is mounted and makes a probe contact with an electrode of the semiconductor device formed on the semiconductor wafer to thereby obtain electrical conduction. The test of the semiconductor device is performed by detecting an output signal from the semiconductor device to which a predetermined test signal has been applied from a measuring device (tester) through the probe.

A probe device for measuring a minute current and a minute voltage from the semiconductor device employs, as a mounting table on which the semiconductor wafer is mounted, a mounting table including an insulating layer, a first conductive layer fixed to one side of the insulating layer, and a second conductive layer fixed to the other side of the insulating layer (see, e.g., Japanese Patent No. 3351956).

However, when the above-mentioned mounting table is used in a wide temperature range (e.g., a temperature range equal to or higher than 300° C.), the mounting table may be warped due to difference in thermal expansion coefficients of the insulating layer and the conductive layers, thereby making it difficult to bring the probe into accurate contact with an electrode of the semiconductor device. Further, due to the difference in thermal expansion coefficients of the insulating layer and the conductive layers, the conductive layers may be detached from the insulating layer and thus the mounting table may be damaged. Furthermore, due to the difference in thermal expansion coefficients of the insulating layer and the conductive layers, stress may be applied to the insulating layer to have a crack in the insulating layer and thus the mounting table may be damaged.

SUMMARY OF THE INVENTION

In view of the above, the present invention provides a probe device capable of performing an accurate test without causing warpage or damage of a mounting table.

In accordance with an aspect, there is provided a probe device for performing an electrical test of a semiconductor device formed on a semiconductor wafer, the probe device including: a mounting table on which the semiconductor wafer is mounted; a driving mechanism configured to bring a probe into contact with an electrode of the semiconductor device mounted on the mounting table; and a temperature control mechanism configured to control a temperature of the mounting table, wherein the mounting table includes a disk-shaped first electrode, a disk-shaped second electrode, and a disk-shaped insulating plate interposed between the first electrode and the second electrode, and wherein the first electrode, the second electrode and the insulating plate are fixed to each other at a fixing part provided at their respective centers, and are locked to be movable in a diametric direction at a locking part provided at an outer side of the fixing part in the diametric direction.

EFFECT OF THE INVENTION

In accordance with the present invention, an accurate test can be performed without generating a twist and damage in a mounting table.

DETAILED DESCRIPTION OF THE EMBODIMENTS

Hereinafter, embodiments of the present invention will be described in detail with respect to the accompanying drawings.

Figure 1:
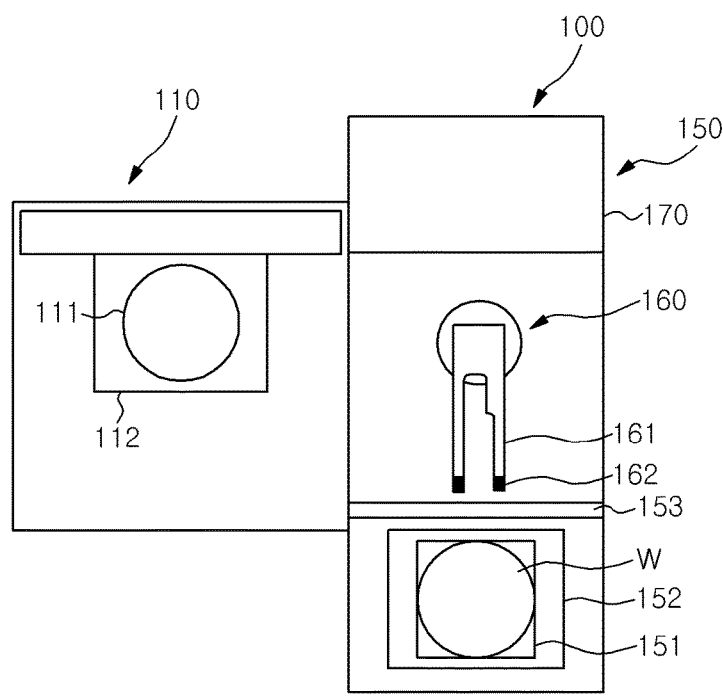
FIG. 1 is a plan view schematically showing an entire configuration of a probe device in accordance with an embodiment of the present invention.

FIG. 1 is a plan view schematically showing an entire configuration of a probe device 100 in accordance with an embodiment of the present invention. The probe device 100 of FIG. 1 includes a measuring unit 110 and a loader unit 150 serving as a transfer unit. The measuring unit 110 is movable in x-y-z-θ directions, and includes a circular disk-shaped mounting table 111 on which a semiconductor wafer W is mounted. By driving the mounting table 111 by a driving mechanism 112, the measuring unit 110 makes probes 210 (see FIG. 2) provided at a probe card and electrodes of semiconductor devices formed on the semiconductor wafer W contact with each other to measure electrical characteristics of the semiconductor devices.

The loader unit 150 includes a load port 152 on which a wafer carrier (wafer cassette or FOUP) 151, which accommodates the semiconductor wafer W, is mounted at the front side of the loader unit 150 (lower side in FIG. 1), and a wafer transfer mechanism 160 adjacent to the load port 152. The loader unit 150 further includes a position alignment mechanism 170 at the rear side thereof (upper side in FIG. 1). The position alignment mechanism 170 detects a position of a notch of the semiconductor wafer W and an eccentricity state of the semiconductor wafer W by rotating the semiconductor wafer W.

The wafer transfer mechanism 160 includes a wafer transfer arm 161 for vacuum-suctioning and transferring the semiconductor wafer W. The wafer transfer arm 161 includes a plurality of (two in this embodiment) suction portions (suction pad) 162 for suctioning and holding the semiconductor wafer W. A vacuum line (not shown) connected to a suction source such as a vacuum pump is connected to the attracting portions 162. The wafer transfer arm 161 may be, if necessary, provided in plural number in a vertically overlapped state.

The wafer transfer mechanism 160 transfers the semiconductor wafer W between the wafer carrier 151 mounted on the load port 152, the position alignment mechanism 170, and the mounting table 111 of the measuring unit 110 by extending, retracting and rotating the wafer transfer arm 161.

The load port 152 is movable up and down by a vertical driving mechanism (not shown). A support frame 153 is provided between the load port 152 and the wafer transfer mechanism 160. The load port 152 includes an optical detector (not shown). When the wafer carrier 151 mounted on the load port 152 is moved up and down, the optical detector detects presense or absence of the semiconductor wafer W and a slot in the wafer carrier 151 which receives the semiconductor wafer W is accommodated.

Figure 2:
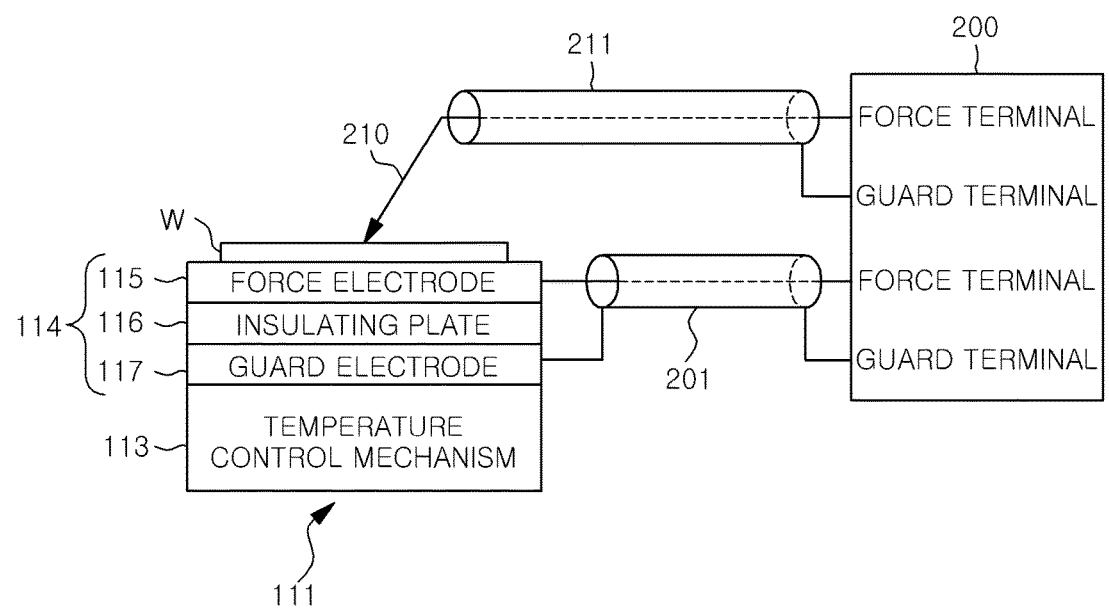
FIG. 2 is a view schematically showing a configuration of a mounting table in the probe device of FIG. 1.

FIG. 2 is a view showing a schematic configuration of the mounting table 111 in the probe device 100 of FIG. 1.

The mounting table 111 of FIG. 2 includes a temperature control mechanism 113 and a mounting part 114 at the top of the temperature control mechanism 113. The temperature control mechanism 113 controls a temperature of the semiconductor wafer W mounted on the mounting table 111 in a predetermined wide temperature range, e.g., in a temperature difference of 300° C. or above (in this embodiment, a range from −60° C. to +400° C.).

The mounting part 114 has a three-layer structure formed of three plate bodies, i.e., a force electrode 115, an insulating plate 116, and a guard electrode 117 sequentially laminated from the side of the semiconductor wafer W mounted on the mounting part 114. The insulating plate 116 is interposed between the force electrode 115 and the guard electrode 117. The structure of the mounting part 114 is not limited to three-layer and may be multi-layer such as four-layer, five-layer or the like.

In the present embodiment, the force electrode 115 is connected to a force terminal of a measuring device 200 through a coaxial cable 201. The guard electrode 117 is connected to a guard terminal of the measuring device 200 through an outer conductor of the coaxial cable 201. A probe 210 contacting with an electrode of the semiconductor device formed on the semiconductor wafer W is connected to the force terminal of the measuring device 200 through an inner conductor of a coaxial cable 211, and also connected to the guard terminal of the measuring device 200 through an outer conductor of the coaxial cable 211. Although only one probe 210 is shown in FIG. 2, a plurality of probes 210 may be used.

The force electrode 115 and the guard electrode 117 are each connected to the measuring device 200 in the same potential as the measuring device 200 and in low impedance. The guard electrode 117 reduces a leaking current flowing through the insulating plate 116 from the force electrode 115 and shields electrical noises intruding from the lower side of the guard electrode 117. Therefore, it is possible to accurately measure a minute current and a minute voltage of the semiconductor device formed on the semiconductor wafer W.

As a material of the force electrode 115 and the guard electrode 117, a conductive metal, e.g., copper, iron, nickel, silver, gold, aluminum, stainless or the like may be used. As a material of the insulating plate 116, an insulating material, e.g., alumina ceramic, boron nitride, quartz, Teflon™, or the like may be used.

Figure 3:
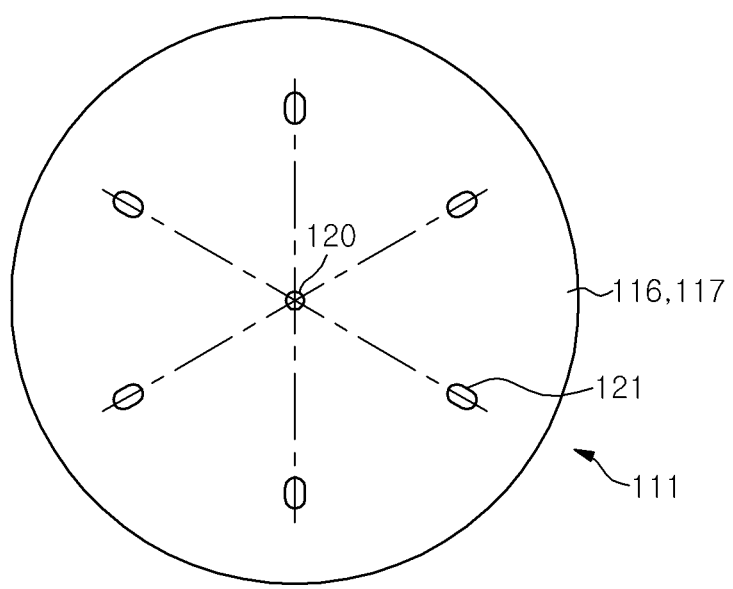
FIG. 3 is a plan view schematically showing an insulating plate and a guard electrode of FIG. 2.

The insulating plate 116 and the guard electrode 117 have a disk shape, and a circular hole 120 that is a circular through hole is formed at the center thereof (see FIG. 3). Around the circular hole 120, a plurality of (six in this embodiment) oblong holes (through holes) 121 is formed to extend in a diametric direction of the mounting table 111 (the insulating plate 116 and the guard electrode 117) (hereinafter, referred to as "diametric direction"). The insulating plate 116 and the guard electrode 117 may have at least one oblong hole 121. In a case of having a plurality of oblong holes 121, as shown in FIG. 3, the oblong holes 121 may be provided at regular intervals (60° interval in FIG. 3) along the circumferential direction of the mounting table 111 (the insulating plate 116 and the guard electrode 117).

Figure 4A:
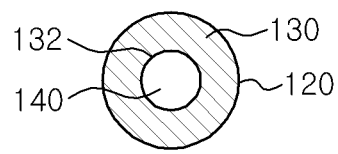
FIG. 4A is a horizontal cross-sectional view of a circular hole shown in FIG. 3.
Figure 4B:
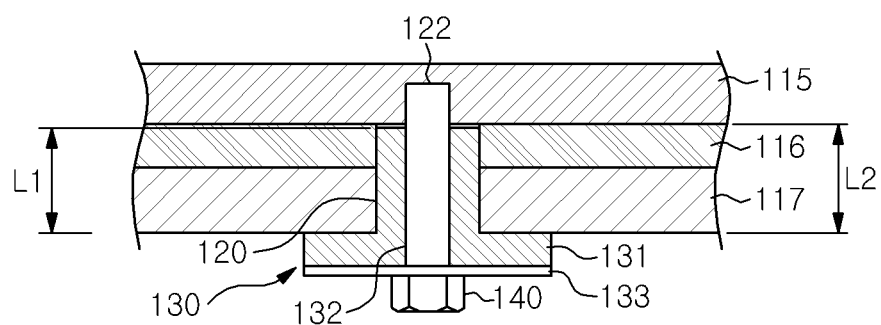
FIG. 4B is a vertical cross-sectional view of the vicinity of the circular hole shown in FIG. 3.
Figure 5A:
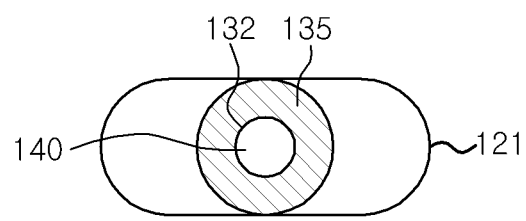
FIG. 5A is a horizontal cross-sectional view of an oblong hole shown in FIG. 3.
Figure 5B:
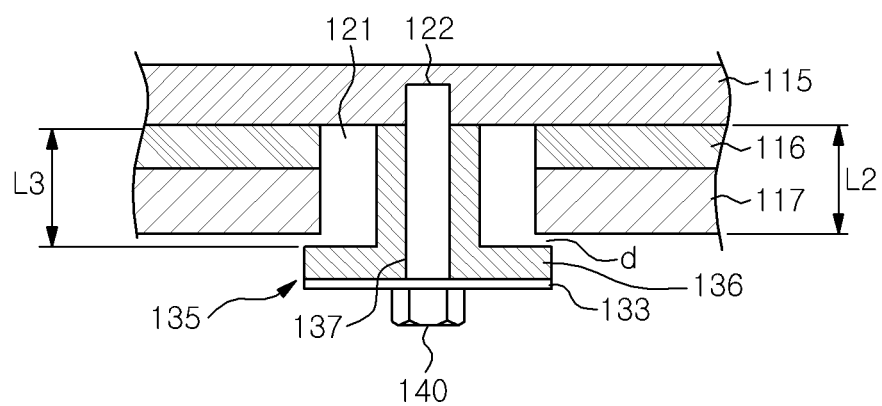
FIG. 5B is a vertical cross-sectional view of the vicinity of the oblong hole shown in FIG. 3.

FIG. 4A is a horizontal cross-sectional view of the circular hole 120 shown in FIG. 3, and FIG. 4B is a vertical cross-sectional view of the vicinity of the circular hole 120 shown in FIG. 3. FIG. 5A is a horizontal cross-sectional view of the oblong hole 121 shown in FIG. 3, and FIG. 5B is a vertical cross-sectional view of the vicinity of the oblong hole 121 shown in FIG. 3. FIGS. 4B and 5B respectively show that parts of the force electrode 115 corresponding to the circular hole 120 and the oblong hole 121 are non-through holes and the force electrode 115 has screw holes 122, into which respective male screws can be screwed, at inner circumferential surfaces of the non-through holes.

A cylindrical collar 130 is fitted into the circular hole 120 (fixing part) of FIG. 4A. The collar 130 is made of an insulating material, e.g., alumina ceramic, mica-ceramic (Micarex or the like) or the like. A flange portion 131 is formed at one end of a cylindrical member of the collar 130. A through hole 132, into which a male screw 140 is inserted, is formed along a central axis of the collar 130. The male screw 140 is made of, e.g., an insulating material.

The force electrode 115, the insulating plate 116 and the guard electrode 117 are sequentially laminated. Then, the collar 130 is inserted into the circular hole 120 from the side of the guard electrode 117, and the male screw 140 is inserted into the through hole 132 of the collar 130 through a washer 133 to be screwed to the screw hole 122.

A length (L1 in FIG. 4B) of the collar 130 except the flange portion 131 is set to be smaller than a sum (L2 in FIG. 4B) of a thickness of the insulating plate 116 and a thickness of the guard electrode 117. By doing so, when the male screw 140 is screwed, the guard electrode 117 and the insulating plate 116 are pressed against the force electrode 115 by the flange portion 131, and the force electrode 115, the insulating plate 116 and the guard electrode 117 are fixed to each other. An outer diameter of the circular hole 120 is preferably set to, e.g., about 1 mm to 20 mm (6 mm in this embodiment). Further, an outer diameter of the collar 130 (outer diameter of the part of the collar 130 except the flange portion 131) is preferably set to, e.g., about 1 mm to 20 mm (6 mm in this embodiment).

In FIGS. 5A and 5B, a cylindrical collar 135 is fitted into the oblong hole 121 (locking part) formed around the circular hole 120. The collar 135 is made of an insulating material, e.g., alumina ceramic, mica-ceramic (Micarex or the like) or the like. A flange portion 136 is formed at one end of the collar 135. A through hole 137, into which the male screw 140 is inserted, is formed along a central axis of the collar 135.

The force electrode 115, the insulating plate 116 and the guard electrode 117 are sequentially laminated. Then, the collar 135 is inserted into the oblong hole 121 from the side of the guard electrode 117, and the male screw is inserted into the through hole 137 of the collar 135 through a washer 133 to be screwed to the screw hole 122.

A length (L3 in FIG. 5B) of the collar 135 except the flange portion 136 is set to be larger than the sum (L2 in FIG. 5B) of the thickness of the insulating plate 116 and the thickness of the guard electrode 117. By doing so, when the male screw 140 is screwed, a gap "d" is formed between a bottom surface of the guard electrode 117 and a top surface of the flange portion 136, so that the insulating plate 116 and the guard electrode 117 are not fixed to the force electrode 115 and can be moved in the diametric direction.

That is to say, the force electrode 115, the insulating plate 116 and the guard electrode 117 are respectively movable in the diametric direction along the oblong hole 121 but are not movable in the circumferential direction. Accordingly, even when the force electrode 115, the insulating plate 116 and the guard electrode 117 are different in their thermal expansion coefficients from each other so that extension/contraction amounts of the the force electrode 115, the insulating plate 116 and the guard electrode 117 in the diametric direction are different from each other, stress is not applied to each of the force electrode 115, the insulating plate 116 and the guard electrode 117.

A size in a cross-section shape of the oblong hole 121 is preferably set to, e.g., about 1 mm to 20 mm (10 mm in this embodiment) in a longer side, and to, e.g., about 1 mm to 20 mm (6 mm in this embodiment) in a shorter side. An outer diameter of the collar 135 (outer diameter of the part of the collar 130 except the flange portion 131) is preferably set to, e.g., about 1 mm to 20 mm (6 mm in this embodiment).

The gap "d" formed between the bottom surface of the guard electrode 117 and the top surface of the flange portion 136 is preferably set to, e.g., about 0.01 mm to 0.5 mm. By doing so, the force electrode 115, the insulating plate 116 and the guard electrode 117 are not pressed by each other in the thickness direction and can be individually moved in the diametric direction.

In the probe device having the above configuration, the mounting part 114 of the mounting table 111 has a three-layer structure in which the force electrode 115, the insulating plate 116 and the guard electrode 117 are laminated. However, the three plate bodies are fixed at the circular hole 120 provided at the center thereof, and are locked to be movable in the diametric direction at the oblong hole 121 provided at the outer side in the diametric direction.

Accordingly, even in a case where a temperature is controlled in a wide temperature range (from −60° C. to +400° C. in this embodiment) by the temperature control mechanism 113, the force electrode 115, the insulating plate 116 and the guard electrode 117 are respectively moved in the diametric direction. Therefore, it is possible to suppress the stress due to difference in the extension/contraction amounts, which is caused from difference in the thermal expansion coefficients of the the force electrode 115, the insulating plate 116 and the guard electrode 117.

Specifically, it is possible to prevent a warpage of the mounting part 114 which would lead to an inaccurate contact of the probe 210 with the electrode of the semiconductor device formed on the semiconductor wafer W, so that a test of the semiconductor device can be performed more precisely. Further, it is possible to prevent damage of the mounting table 111 such as detachment of the force electrode 115 and the guard electrode 117 from the insulating plate 116, cracks in the insulating plate 116, and the like.

Next, a test sequence of the semiconductor wafer W by the probe device 100 having the above configuration will be described.

First, when the wafer carrier 151 in which the semiconductor wafer W is accommodated is mounted on the load port 152 of the loader unit 150, the vertical driving mechanism moves the wafer carrier 151 and the load port 152 up and down. The optical detector detects a slot in the wafer carrier 151 in which the semiconductor wafer W is accommodated.

The wafer transfer arm 161 of the wafer transfer mechanism 160 holds the semiconductor wafer W and transfers the semiconductor wafer W to the position alignment mechanism 170. The position alignment mechanism 170 detects a notch of the semiconductor wafer W to find a position of the semiconductor wafer W.

After completing the position detection by the position alignment mechanism 170, the wafer transfer arm 161 of the wafer transfer mechanism 160 receives the semiconductor wafer W from the position alignment mechanism 170 and mounts the semiconductor wafer W on the mounting table 111 of the measuring unit 110.

When the probe 210 is made to contact with the semiconductor device of the semiconductor wafer W on the mounting table 111, an electrical conduction is obtained (see FIG. 2). A test signal is supplied to the semiconductor device from the measuring device and an output signal from the semiconductor device is measured to thereby test electrical characteristics of the semiconductor device.

After completing the test on the electrical characteristics of the semiconductor device of the semiconductor wafer W, the wafer transfer arm 161 of the wafer transfer mechanism 160 receives the semiconductor wafer W on the mounting table 111 and accommodates the semiconductor wafer W in the wafer carrier 151. Then, the test of the semiconductor wafer W is completed.

As described above, the present invention has been described with respect to the above embodiment. However, the present invention is not limited to the above embodiment.

The present application claims priority based on Japanese Patent Application No. 2013-065510 filed on Mar. 27, 2013, the entire contents of which are incorporated herein by reference.

DESCRIPTION OF REFERENCE NUMERALS 100 probe device
110 measuring unit
111 mounting table
150 loader unit
151 wafer carrier
152 load port
153 support frame
160 wafer transfer mechanism
161 wafer transfer arm
162 suction portion
170 position alignment mechanism

What is claimed is:
1. A probe device for performing an electrical test of a semiconductor device formed on a semiconductor wafer, the probe device comprising:
a mounting table configured to mount the semiconductor wafer;

a driving mechanism configured to bring a probe into contact with an electrode of the semiconductor device when the semiconductor wafer is mounted on the mounting table; and a temperature control mechanism configured to control a temperature of the mounting table, wherein the mounting table includes a first electrode that is disk-shaped, a second electrode that is disk-shaped, and a insulating plate that is disk-shaped and interposed between the first electrode and the second electrode, and wherein the first electrode, the second electrode and the insulating plate are fixed to each other at a fixing part provided at their respective centers and are locked to be relatively movable to each other in a diametric direction at a locking part provided at an outer side of the fixing part in the diametric direction, the locking part being provided in the mounting table.

2. The probe device of claim 1, wherein the locking part is provided in plural number at intervals along a circumferential direction of the mounting table.

3. The probe device of claim 1, wherein in the locking part, a screw hole is formed in the first electrode and an oblong hole penetrating through the insulating plate and the second electrode in their thickness direction is formed at a position of the insulating plate and the second electrode corresponding to the screw hole, and wherein the first electrode, the insulating plate and the second electrode are sequentially laminated, and wherein a male screw is inserted from a side of the second electrode and screwed to the screw hole.

4. The probe device of claim 3, wherein a horizontal cross-sectional shape of the oblong hole extends in the diametric direction.

5. The probe device of claim 3, wherein the male screw is made of an insulating material.

6. The probe device of claim 3, wherein in the fixing part, another screw hole is formed in the first electrode and a circular hole penetrating through the insulating plate and the second electrode in their thickness direction is formed at a position of the insulating plate and the second electrode corresponding to the another screw hole, and wherein collars each having a cylindrical member and a flange portion at one end of the cylindrical member are respectively fitted into the circular hole of the fixing part and the oblong hole of the locking part, and a through hole, into which the male screw is inserted, is formed in each of the collars along a central axis of the cylindrical member.

7. The probe device of claim 6, wherein in the fixing par, a length of the collar except the flange portion is set to be smaller than a sum of a thickness of the insulating plate and a thickness of the second electrode.

8. The probe device of claim 6, wherein in the locking part, a length of the collar except the flange portion is set to be larger than a sum of a thickness of the insulating plate and a thickness of the second electrode.

9. The probe device of claim 6, wherein the collars are made of an insulating material.

10. The probe device of claim 1, wherein the first electrode is a force electrode and the second electrode is a guard electrode.

* * * * *